US012144152B2

(12) United States Patent
Kameda

(10) Patent No.: US 12,144,152 B2
(45) Date of Patent: Nov. 12, 2024

(54) ELECTRIC DEVICE

(71) Applicant: NEC Corporation, Tokyo (JP)

(72) Inventor: Shingo Kameda, Tokyo (JP)

(73) Assignee: NEC CORPORATION, Tokyo (JP)

( * ) Notice: Subject to any disclaimer, the term of this patent is extended or adjusted under 35 U.S.C. 154(b) by 864 days.

(21) Appl. No.: 17/277,202

(22) PCT Filed: Sep. 18, 2019

(86) PCT No.: PCT/JP2019/036488
§ 371 (c)(1),
(2) Date: Mar. 17, 2021

(87) PCT Pub. No.: WO2020/059734
PCT Pub. Date: Mar. 26, 2020

(65) Prior Publication Data
US 2021/0410322 A1 Dec. 30, 2021

(30) Foreign Application Priority Data
Sep. 21, 2018 (JP) .................................. 2018-177616

(51) Int. Cl.
*H05K 7/20* (2006.01)
*G02B 6/44* (2006.01)
(Continued)

(52) U.S. Cl.
CPC ......... *H05K 7/2039* (2013.01); *G02B 6/4427* (2013.01); *H01S 5/02469* (2013.01); *H04B 10/29* (2013.01)

(58) Field of Classification Search
USPC ......................................................... 372/36
See application file for complete search history.

(56) References Cited

U.S. PATENT DOCUMENTS 5,666,457 A * 9/1997 Ogiya .................. G02B 6/4448
385/139
6,151,341 A * 11/2000 Bull ...................... H01S 5/4025
372/50.12
(Continued)

FOREIGN PATENT DOCUMENTS

CN 101749979 A 6/2010
JP H09-218320 A 8/1997
(Continued)

OTHER PUBLICATIONS

International Search Report for PCT Application No. PCT/JP2019/036488, mailed on Dec. 3, 2019.
(Continued)

*Primary Examiner* — Tuan N Nguyen

(57) ABSTRACT

[Problem] To suppress the number of man-hours required to handle design changes accompanying a change in heat generation in an internal unit stored inside an electric device. [Solution] The present invention includes: at least one internal unit, which is a heat generating body and has a prescribed cross-sectional external shape; at least one heat conduction unit, which is a good conductor of heat and has a prescribed cross-sectional external shape; and a device housing in which two or more of the internal unit and the heat conduction unit can be stored in a state of being adjacent to each other with the prescribed cross-sectional external shapes thereof overlapping each other, the device housing thermally connecting to the stored internal unit or the stored heat conduction unit.

19 Claims, 8 Drawing Sheets

(51) Int. Cl.
*H01S 5/024* (2006.01)
*H04B 10/29* (2013.01)

(56) References Cited

U.S. PATENT DOCUMENTS

2005/0200943 A1* 9/2005 DeVincentis ........ G02B 6/4427
359/333
2012/0155028 A1* 6/2012 Stokes ............... H05K 7/20463
361/699

FOREIGN PATENT DOCUMENTS

| JP | H10-246819 A | 9/1998 |
|----|----|----|
| JP | H11-289175 A | 10/1999 |
| JP | 2001-320824 A | 11/2001 |
| JP | 2001-327061 A | 11/2001 |
| JP | 2002-291146 A | 10/2002 |
| JP | 2017-194799 | 10/2017 |
| WO | 03/075483 A1 | 9/2003 |

OTHER PUBLICATIONS

English translation of Written opinion for PCT Application No. PCT/JP2019/036488, mailed on Dec. 3, 2019.
Extended European Search Report for EP Application No. EP19863175.6 dated on Oct. 5, 2021.
CN Office Action for CN Application No. 201980061843.3, mailed on Mar. 1, 2023 with English Translation.
Japanese Office Communication for JP Application No. 2020-548536 mailed on Aug. 9, 2022 with English Translation.

* cited by examiner

ELECTRIC DEVICE

This application is a National Stage Entry of PCT/JP2019/036488 filed on Sep. 18, 2019, which claims priority from Japanese Patent Application 2018-177616 filed on Sep. 21, 2018, the contents of all of which are incorporated herein by reference, in their entirety.

TECHNICAL FIELD

The present invention relates to a technique for improving heat dissipation in an electric device.

BACKGROUND ART

As demand for communication infrastructure expands, there is a requirement for larger capacity and higher power in a seabed-installed apparatus. Accompanying a requirement for a large capacity and a high output, a temperature rise inside a housing of a seabed-installed apparatus due to an increase in power consumption of the seabed-installed apparatus has become a problem. Therefore, improvement in heat dissipation inside the housing of the seabed-installed apparatus is an issue.

PTL 1 discloses an example of a technique for improving heat dissipation in a seabed-installed apparatus. In an optical submarine repeater of PTL 1, a plurality of circuit units are accommodated in a heat dissipation buffer having a cylindrical shape. The heat dissipation buffer is accommodated in a pressure-resistant housing in a state of being in pressure contact with an inner surface of the pressure-resistant housing having a cylindrical shape. Heat generated in the circuit unit is highly efficiently conducted to the pressure-resistant housing through the heat dissipation buffer. As a result of the above-described configuration, in the optical submarine repeater of PTL 1, the heat generated in the circuit unit is efficiently dissipated to an outside of the seabed-installed apparatus.

Another example of a technique for improving heat dissipation in a seabed-installed apparatus is disclosed in PTL 2. In submarine equipment for accommodating an optical circuit of PTL 2, a plurality of circuit units are accommodated in a metal mesh spring having a cylindrical shape. The metal mesh spring is accommodated in a pressure-resistant housing having a cylindrical shape. The pressure-resistant housing is filled with an insulating liquid (e.g., a fluorine-based inert liquid) having a heat transfer coefficient higher than that of nitrogen gas. Heat generated in the circuit unit is conducted to the pressure-resistant housing through the insulating liquid and the metal mesh spring. As a result of the above-described configuration, in the submarine equipment for accommodating the optical circuit of PTL 2, the heat generated in the circuit unit is efficiently dissipated to an outside of the submarine equipment for accommodating the optical circuit.

CITATION LIST

Patent Literature

[PTL 1] Japanese Unexamined Patent Application Publication No. H09-218320
[PTL 2] Japanese Unexamined Patent Application Publication No. 2001-327061

SUMMARY OF INVENTION

Technical Problem

However, in the technique of PTL 1 or PTL 2, when an amount of heat generated in the seabed-installed apparatus changes in accordance with a design change of the seabed-installed apparatus, it is sometimes necessary to change an external shape of the seabed-installed apparatus.

An example will be described in which a plurality of internal units (for example, circuit units in PTL 1 or PTL 2) having a predetermined cross-sectional shape are stored in a housing of a seabed-installed apparatus in a state in which the internal units are superposed on each other in a direction perpendicular to a predetermined cross-section.

FIG. 8 is a schematic diagram (cross-sectional diagram) illustrating a configuration of a related seabed-installed apparatus. In a seabed-installed apparatus 200 in the present example (for example, an optical submarine repeater), a device housing 230 stores n (n is an integer of two or more) internal units 211, 212, . . . . Each of the internal units 211, 212, . . . includes a heat generating body 261, 262, . . . (for example, a laser diode (hereinafter, also referred to as a LD)) and a heat sink 271, 272, . . . , respectively. Since air does not enter or exit a housing (enclosed housing) of a seabed-installed apparatus in general, it is difficult to perform cooling using a fan, which is widely seen in a land-installed apparatus. Therefore, heat generated in the heat generating body 261, 262, . . . is sequentially conducted to the heat sinks 271, 272, . . . in the internal units 211, 212, . . . or housings thereof, the device housing 230 of the seabed-installed apparatus 200, and sea water outside the seabed-installed apparatus 200. Therefore, when an amount of heat generated in a certain internal unit 211, 212, . . . increases beyond an assumption made in designing, sufficient heat dissipation cannot be performed. In FIG. 8, an example of a heat dissipation path is illustrated by a thick arrow.

For example, it is assumed that an amount of heat generated in the internal unit 211 increases as a result of a design change in the internal unit 211. In order to achieve sufficient heat dissipation, it may be necessary, for example, to increase a cross-sectional area of the internal unit 211 in a plane perpendicular to a submarine cable, or to increase a distance between the internal unit 211 and the internal unit 212. Herein, it is assumed that a length direction of the submarine cable and an adjacent direction of the internal units 211, 212, . . . are both in an X direction in FIG. 8. As a result, it is necessary to change an external shape (a cross-sectional area in a cross-section perpendicular to the submarine cable, a length in a direction parallel to the submarine cable, or the like) of the seabed-installed apparatus 200. Specifically, due to a design change accompanied by a change in heat generation in the internal unit 211, a design change in other internal units 212, . . . that do not need a design change, or a design change in the entire seabed-installed apparatus 200 is required.

As described above, the technique in PTL 1 or PTL 2 has a problem that the number of man-hours required to cope with a design change accompanied by a change in heat generation in a certain internal unit is large. The man-hours required to cope with the design change are, for example, man-hours for designing and manufacturing the seabed-installed apparatus, man-hours for designing and manufacturing a related device (such as installation equipment of the submarine cable) that handles the seabed-installed apparatus after the design change, or the like.

The present invention is made in view of the above-mentioned problem, and a main object thereof is to suppress man-hours required to cope with a design change accompanied by a change in heat generation in an internal unit stored in an electric device.

Solution to Problem

In one aspect of the present invention, an electric device includes: one or more internal units that are heat generating bodies having a predetermined cross-sectional external shape; one or more heat conduction units that are good conductors of heat and have the predetermined cross-sectional external shape; and a device housing that is capable of storing two or more of the internal units or the heat conduction units in a state in which the internal units or the heat conduction units are adjacent to each other in an direction in which the predetermined cross-sectional external shapes overlap each other, and is thermally connected to the stored internal units or stored heat conduction units.

Advantageous Effects of Invention

According to the present invention, it is possible to suppress the number of man-hours required to cope with a design change accompanied by a change in heat generated in an internal unit stored in an electric device.

EXAMPLE EMBODIMENT

Figure 1:
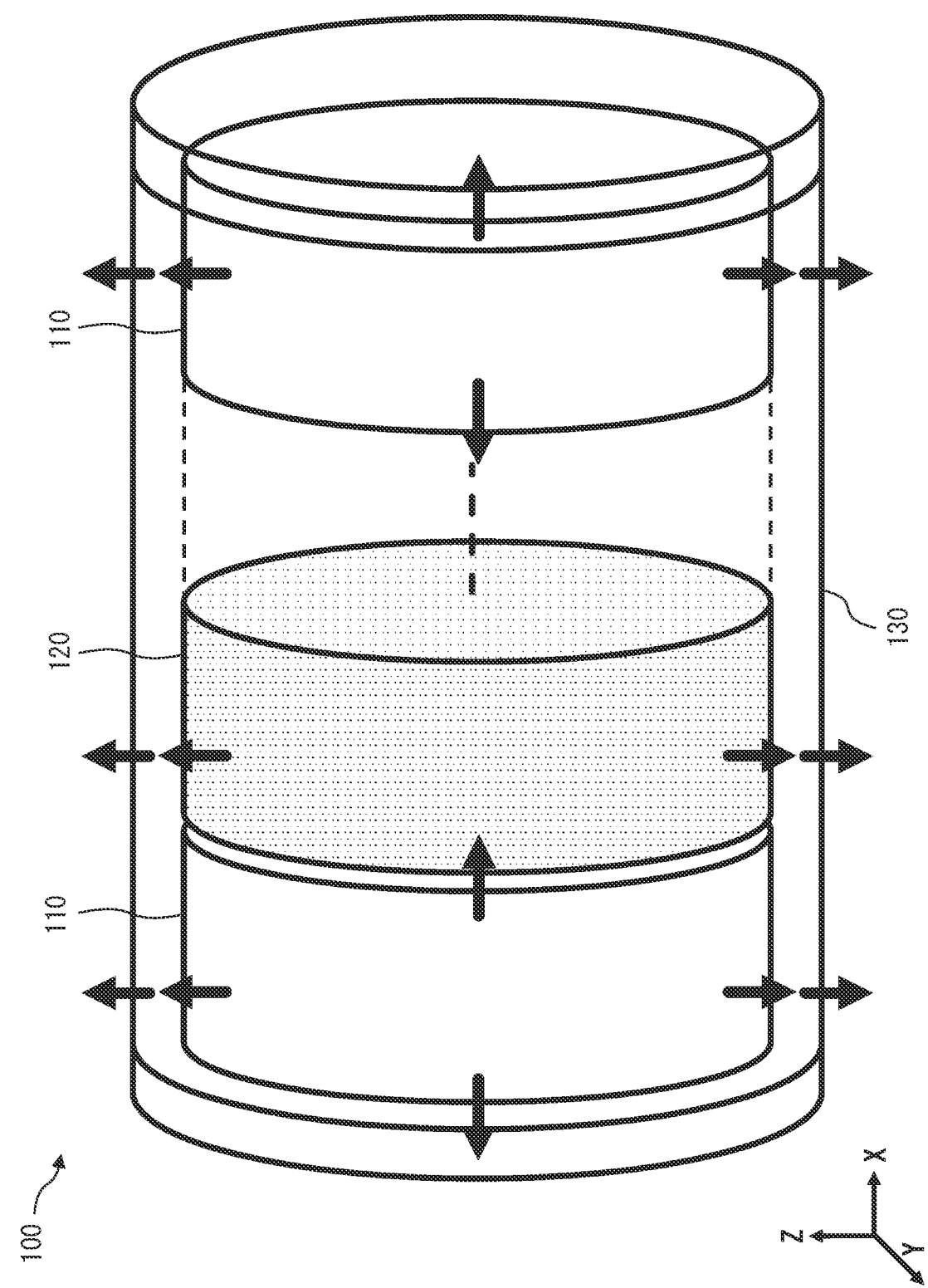
FIG. 1 is a perspective diagram illustrating an example of a configuration of an electric device according to a first example embodiment of the present invention.

Hereinafter, example embodiments of the present invention will be described in detail with reference to the drawings. In all the drawings, equivalent components are denoted by the same reference numerals, and a description thereof is omitted as appropriate.

First Example Embodiment

A first example embodiment of the present invention, which is a basis of each example embodiment of the present invention, will be described.

A configuration of the present example embodiment will be described.

FIG. 1 is a perspective diagram illustrating an example of a configuration of an electric device according to the first example embodiment of the present invention. In diagrams following FIG. 1 and the following description, a direction in which the electric device is installed is an example, and a direction in which the electric device is actually installed may be any direction. In the diagrams following FIG. 1 and the following description, a width direction of the electric device is denoted by "X", a depth direction is denoted by "Y", and a height (thickness) direction is denoted by "Z" when viewed from a certain direction. Specifically, the X direction, the Y direction, and the Z direction are directions orthogonal to each other. In the X direction, the Y direction, and the Z direction, a right direction, a front direction, and an upper direction are referred to as "positive side", and a left direction, a back direction, and a lower direction are referred to as "negative side". In the following description, the positive side in the X direction is referred to as "X+" side, the negative side in the X direction is referred to as "X−" side, the positive side in the Y direction is referred to as "Y+" side, the negative side in the Y direction is referred to as "Y−" side, the positive side in the Z direction is referred to as "Z+" side, and the negative side in the Z direction is referred to as "Z−" side. In FIG. 1, an inside of the electric device is illustrated in a perspective view.

An electric device 100 according to the present example embodiment provides a predetermined function, and dissipates, to outside, heat generated internally when providing the predetermined function. The electric device 100 is, for example, an optical submarine cable repeater. The electric device 100 includes one or more internal units 110, one or more heat conduction units 120, and a device housing 130.

The internal unit 110 is a heat generating body having a predetermined cross-sectional external shape (Y-Z plane in FIG. 1). However, external shapes of the internal units 110 in the direction (X direction in FIG. 1) perpendicular to a predetermined cross section may be different from each other. The internal unit 110 provides a partial function necessary for implementing the predetermined function to be provided by the electric device 100. The internal unit 110 then dissipates, to the outside, heat generated internally when providing the partial function. The internal unit 110 may be connected to a signal cable 140 (described later). The predetermined cross-sectional external shape is, for example, circular, elliptical, or polygonal. In the example illustrated in FIG. 1, the predetermined cross-sectional external shape is circular, and the internal unit 110 forms an external shape of a disk.

The heat conduction unit 120 is a good conductor of heat and has the same predetermined cross-sectional external shape as the internal unit 110. However, external shapes of the heat conduction units 120 in a direction perpendicular to the predetermined cross section may be different from each other. The heat conduction unit 120 dissipates heat conducted from the adjacent internal unit 110 to the device housing 130 or the adjacent heat conduction unit 120. The heat conduction unit 120 is made of, for example, metal (copper, aluminum, or the like) or carbon (graphite, carbon nanotubes, diamond, or the like), and has a plate-like external shape (an inside may be a cavity). In the example illustrated in FIG. 1, the heat conduction unit 120 has an external shape of a disk.

The device housing 130 is capable of storing two or more of the internal units 110 or the heat conduction units 120 (hereinafter, also referred to simply as "unit") in a state in which the internal units or the heat conduction units are adjacent to each other in a direction (X direction in FIG. 1) in which the predetermined cross-sectional external shapes overlap each other. Herein, the device housing 130 thermally connects the adjacent units. The device housing 130 may thermally connect the adjacent units by, for example, storing the adjacent units in such a way as to overlap and contact each other in the X direction. The device housing 130 is also thermally connected to the stored unit. The device housing 130 is thermally connected to the stored unit, for example, by the stored unit contacting an inner surface of the device housing 130. In the example illustrated in FIG. 1, the device housing 130 has a cylindrical shape having both bottom surfaces. The device housing 130 then stores one or more of the internal units 110 and one or more of the heat conduction units 120 in a state in which an outer surface of the stored unit contacts the inner surface of the device housing 130. The device housing 130 may be thermally connected to the stored unit via, for example, a heat conductive sheet, a metal member, a carbon member, a refrigerant (e.g., a fluorine-based inert liquid), or the like.

An operation in the present example embodiment will be described.

Figure 8:
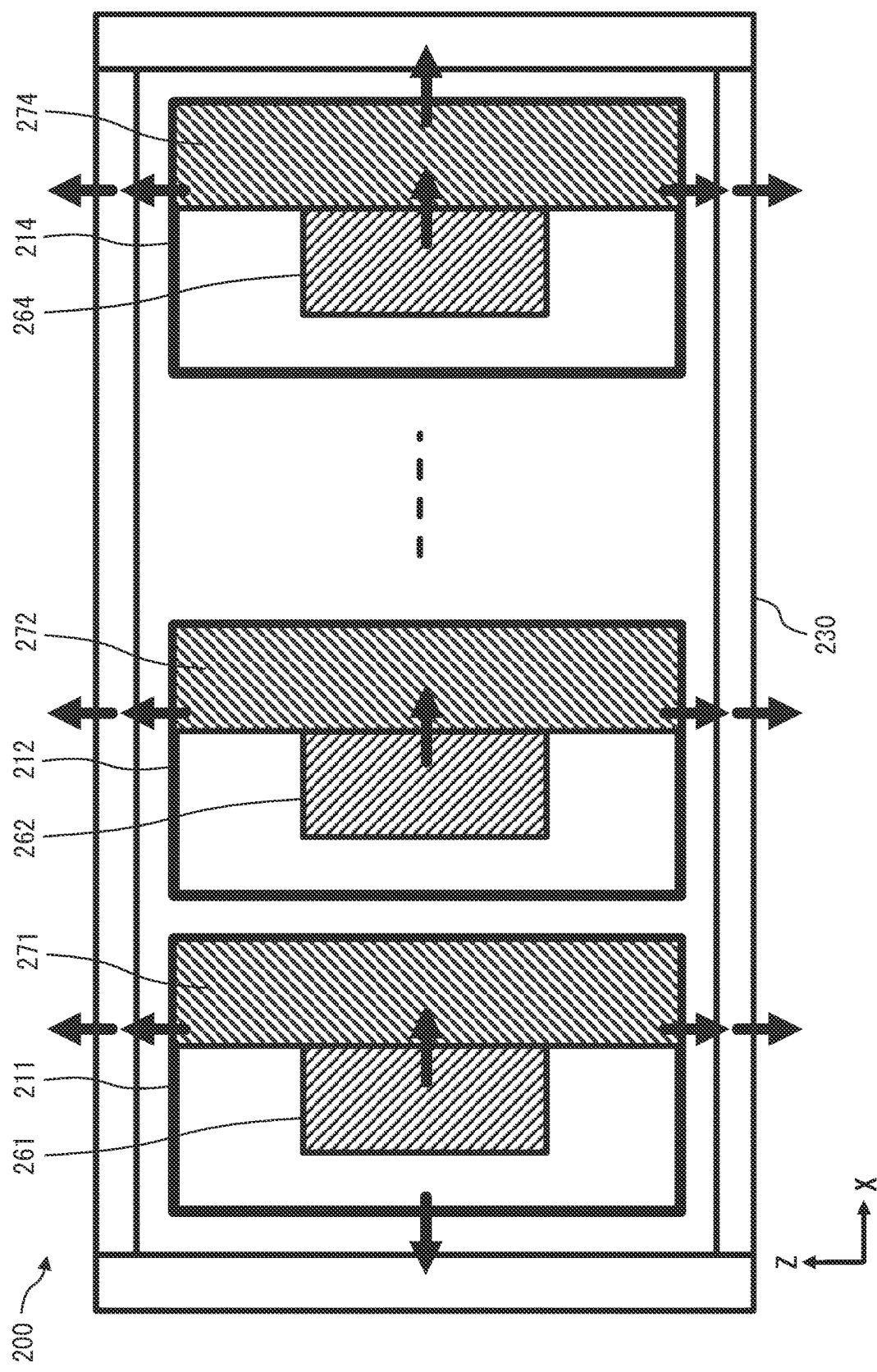
FIG. 8 is a schematic diagram illustrating a configuration of a related seabed-installed apparatus.

The internal unit 110 is thermally connected to the heat conduction unit 120, and the internal unit 110 and the heat conduction unit 120 are thermally connected to the device housing 130. As a result, heat generated in the internal unit 110 is conducted to the device housing 130 directly or via the heat conduction unit 120. The device housing 130 then dissipates the heat conducted to the device housing 130 to an outside of the device housing 130. Specifically, a heat dissipation path is formed by starting from the internal unit 110, passing directly or through the heat conduction unit 120, passing through the device housing 130, and ending at an outside of the electric device 100 (sea water, outside air, or the like). In FIG. 1, an example of the heat dissipation path is illustrated by a thick arrow. Herein, a heat dissipation path through the heat conduction unit 120 is added, compared to the heat dissipation path in the electric device 100 and a heat dissipation path in the related seabed-installed apparatus illustrated in FIG. 8.

Figure 2:
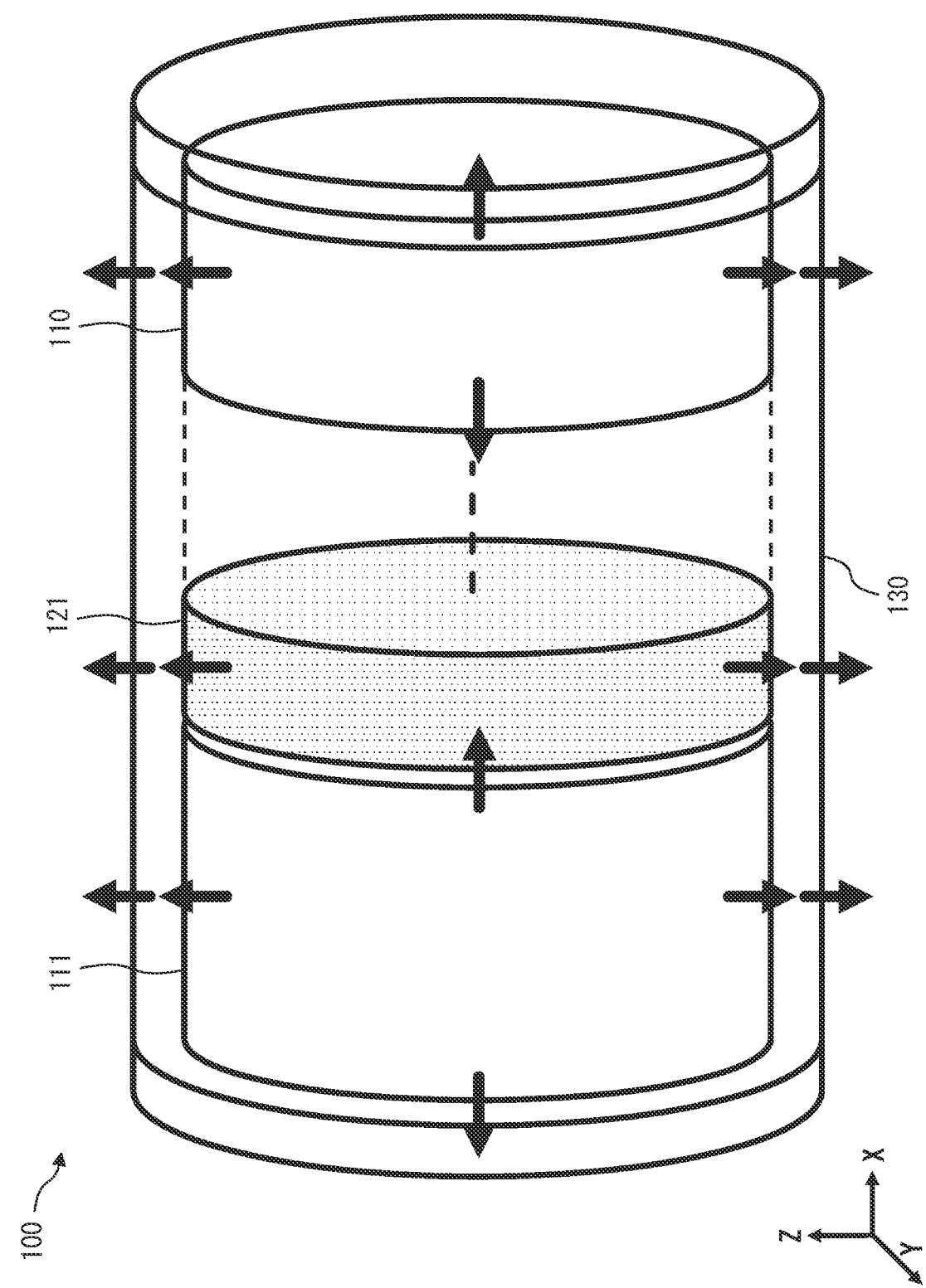
FIG. 2 is a perspective diagram illustrating an operation of the electric device according to the first example embodiment of the present invention.

FIG. 2 is a perspective diagram illustrating the operation of the electric device according to the first example embodiment of the present invention.

It is assumed that one of the internal units 110 included in the electric device 100 illustrated in FIG. 1 is replaced with an internal unit 111 as a result of a design change of the unit, as illustrated in FIG. 2. The internal unit 111 is a heat generating body having the same predetermined cross-sectional external shape as the internal unit 110 (in FIGS. 1 and 2, a circular shape having the same radius in a Y-Z plane). However, it is assumed that an external dimension (for example, a width in the X direction in FIG. 2) of the internal unit 111 changes from an external dimension (for example, a width in the X direction in FIG. 1) of the internal unit 110. It is also assumed that an amount of heat generated in the internal unit 111 changes from the amount of heat generated in the internal unit 110.

Similarly, as illustrated in FIG. 2, it is assumed that the one internal unit 110 is replaced with the internal unit 111, and accompanying the replacement, one of the heat conduction units 120 is replaced with a heat conduction unit 121. The heat conduction unit 121 is a good conductor of heat and has a predetermined cross-sectional external shape that is the same as the heat conduction unit 120 (same as the internal unit 110). However, it is assumed that an external dimension (for example, a width in the X direction in FIG. 2) of the heat conduction unit 121 changes from an external dimension (for example, a width in the X direction in FIG. 1) of the heat conduction unit 120. However, the external dimension of the heat conduction unit 121 is determined in such a way that an external dimension (for example, a width in the X direction and a cross-sectional external shape in the Y-Z plane in FIG. 2) acquired by combining the one internal unit 111 and the one heat conduction unit 121 is the same as an external dimension (for example, a width in the X direction and a cross-sectional external shape in the Y-Z plane in FIG. 1) acquired by combining the one internal unit 110 and the one heat conduction unit 120. Herein, thermal resistance of the heat conduction unit 121 may be changed from thermal resistance of the heat conduction unit 120. Specifically, for example, when an amount of heat generated in the internal unit 111 becomes larger than an amount of heat generated in the internal unit 110, the heat conduction unit 121 may be replaced with a unit having lower heat resistance (higher heat dissipation property) than the heat conduction unit 120 according to the amount of heat generated in the internal unit 111. The heat conduction units 120, 121, . . . may have different structures, materials, and the like. In FIG. 2, an example of the heat dissipation path is illustrated by a thick arrow. In FIG. 2, a heat dissipation path is formed by starting from the internal unit 111, passing directly or via the heat conduction unit 121, passing via the device housing 130, and ending at the outside of the electric device 100 (sea water, outside air, or the like).

(When Design is Made Assuming a Worst Case)

The electric device 100 may be designed in such a way as to be operatable both before and after a design change of a unit. For example, in the example illustrated in FIGS. 1 and 2, the electric device 100 may be designed in such a way as to be functionally and thermally capable of normally operating, even when a pair of the one internal unit 110 and the one heat conduction unit 120 is replaced with a pair of the one internal unit 111 and the one heat conduction unit 121. This condition is achieved, for example, by setting the thermal resistance of the heat conduction unit 120, . . . in such a way that a temperature of the internal unit 110, . . . does not become equal to or higher than a predetermined temperature in a worst case (a pair of the internal unit 110, . . . having a largest heat generation amount and the heat conduction unit 120, . . . having largest thermal resistance) within a range of assumed design changes.

(When Replacing with a Heat Conduction Unit that Compensates for an Increase in Amount of Heat Generated in an Internal Unit)

In a case where the one internal unit 110 is replaced, in accordance with a design change of the one internal unit 110, with the one internal unit 111 having a larger heat generation amount, the heat conduction unit 120 may be replaced with the heat conduction unit 121 (for example, using a material having a high heat dissipation property, and the like) having heat resistance smaller by an amount being able to cope with an increase in heat generation amount in the internal unit 111.

In the two cases described above, in the electric device 100, it is unnecessary to change, in accordance with a design change in the one internal unit 110, design of another component other than the heat conduction unit 120 (device housing 130, the internal unit 110 that does not need a design change, and the like) and to manufacture the another component. In addition, even when there is a related device for installing the electric device 100 (an installation facility of the electric device 100, and the like), it is unnecessary to change design of the related device and to manufacture the related device.

In the above description, an example in which the one internal unit 110 and the one heat conduction unit 120 are replaced with the one internal unit 111 and the one heat conduction unit 121 has been described. However, the replacement of the unit in the present example embodiment is not limited to the example described above. Specifically, the one internal unit 110 may be replaced with a plurality of the internal units 111. Also, the one heat conduction unit 120 may be replaced with a plurality of the heat conduction units 121, or may be removed from the electric device 100. A plurality of the internal units 110 may be replaced with the one internal unit 111. Also, a plurality of the heat conduction units 120 may be replaced with the one heat conduction unit 121, or may be removed from the electric device 100.

As described above, in the electric device 100 according to the present example embodiment, the internal units 110, 111, . . . and the heat conduction units 120, 121, . . . have the same predetermined cross-sectional external shape. Further, a design change accompanied by a change in heat generation is made on the internal unit 110. As a result of the design change, the internal unit 110 is replaced with the internal unit 111. Herein, an external shape of the heat conduction unit 121 is determined in such a way that an external shape acquired by combining the internal unit 111 and the heat conduction unit 121 becomes the same as an external shape acquired by combining the internal unit 110 and the heat conduction unit 120. Specifically, a change from the external shape of the internal unit 110 to the external shape of the internal unit 111 (e.g., a change in width in the X direction in FIGS. 1 and 2) is offset by a change from the external shape of the heat conduction unit 120 to the external shape of the heat conduction unit 121 (e.g., a change in width in the X direction in FIGS. 1 and 2). Meanwhile, the unit is designed in such a way as to be operable both before and after a design change, or the heat conduction unit is able to cope with an increase in amount of heat generated in the internal unit after a design change. Specifically, in the electric device 100, it is unnecessary to change, in accordance with the design change of the one internal unit 110, design of another component other than the heat conduction unit 120 and the like (the device housing 130, the internal unit 110 that does not need a design change, and the like) and to manufacture the another component. In addition, when there is a related device for installing the electric device 100 (an installation facility of the electric device 100, and the like), it is unnecessary to change design of the related device and to manufacture the related device. Therefore, the electric device 100 according to the present example embodiment has an advantageous effect of suppressing the number of man-hours required to cope with a design change accompanied by a change in heat generated in the internal unit stored in the electric device.

A modification example of the present example embodiment will be described.

Figure 3:
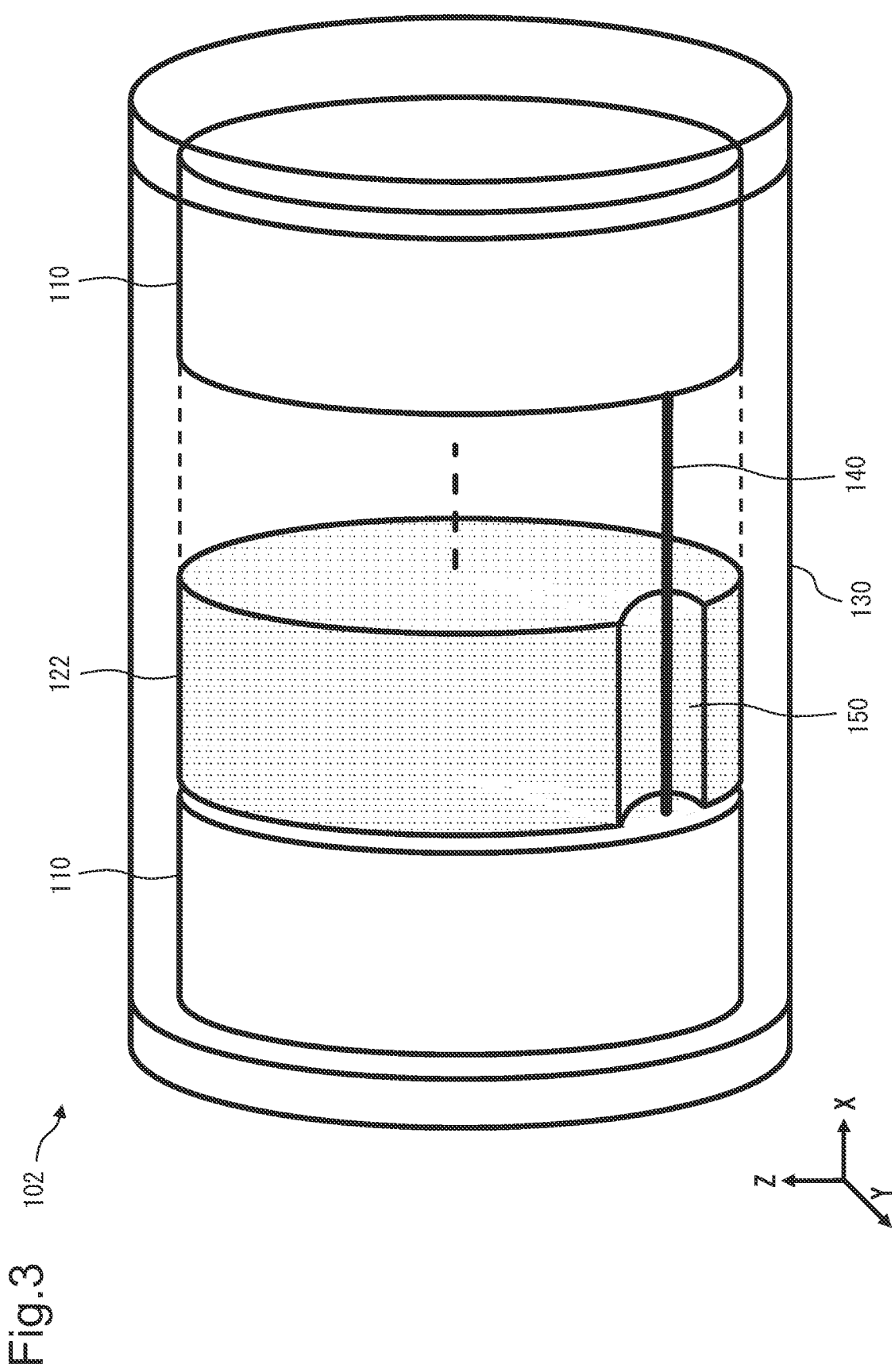
FIG. 3 is a perspective diagram illustrating a modification example of the configuration of the electric device according to the first example embodiment of the present invention.

FIG. 3 is a perspective diagram illustrating a modification example of the configuration of the electric device according to the first example embodiment of the present invention.

In an electric device 102 according to the present modification example, some of the heat conduction units 120 according to the present example embodiment described above are replaced with heat conduction units 122. Two of the internal units 110 stored in the device housing 130 are connected to each other via a signal cable 140.

The heat conduction unit 122 has a slot part 150 through which the signal cable 140 can be threaded. The slot part 150 is a slot or a through hole through which the signal cable 140 can be threaded in the X direction. In the example illustrated in FIG. 3, the slot part 150 is a slot formed at a predetermined position on an outer periphery of the heat conduction unit 122 in the X direction. The slot part 150 formed in the heat conduction unit 122 allows the signal cable 140 to be threaded through between the two internal units 110 connected to each other via the signal cable 140.

As a result of the above-described configuration, the present modification example has an advantageous effect that, when the two internal units 110 are connected to each other via the signal cable 140, it is possible to easily cope with a design change accompanied by a change in heat generated in the internal units stored in the electric device.

Second Example Embodiment

Next, a second example embodiment of the present invention based on the first example embodiment of the present invention will be described. An electric device in the present example embodiment is a seabed-installed apparatus. In the present example embodiment, a configuration of the electric device will be described in more detail.

A configuration in the present example embodiment will be described.

Figure 4:
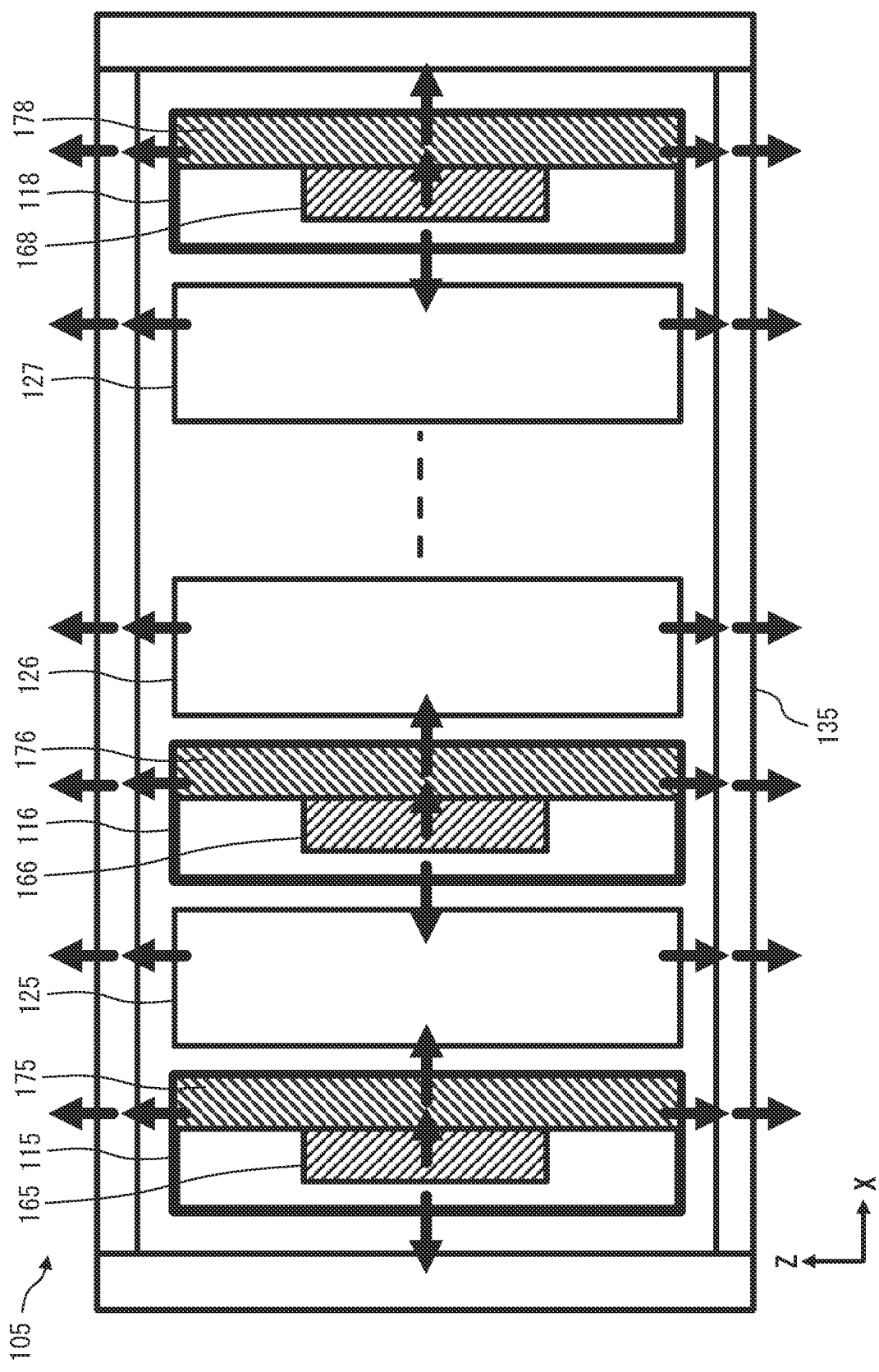
FIG. 4 is a cross-sectional diagram illustrating an example of a configuration of a seabed-installed apparatus according to a second example embodiment of the present invention.

FIG. 4 is a cross-sectional diagram illustrating an example of the configuration of the seabed-installed apparatus according to the second example embodiment of the present invention. More specifically, FIG. 4 illustrates a cross-sectional diagram in the X-Z plane.

A seabed-installed apparatus (electric device) 105 in the present example embodiment provides a predetermined function, and dissipates, to outside, heat generated internally when the predetermined function is provided. The seabed-installed apparatus 105 is, for example, an optical submarine cable repeater. The seabed-installed apparatus 105 includes one or more internal units 115, . . . , one or more heat conduction units 125, . . . , and a device housing 135.

The internal units 115, . . . are heat generating bodies having a predetermined cross-sectional external shape (Y-Z plane in FIG. 4). The internal units 115, . . . include, for example, a laser diode. However, external shapes of the internal units 115, . . . in a direction perpendicular to a predetermined cross section (X direction in FIG. 4) may be different from each other. The internal units 115, . . . provide a partial function necessary for achieving the predetermined function provided by the seabed-installed apparatus 105. The internal units 115, . . . then dissipate, to the outside, heat generated internally when providing the partial function. The internal units 115, . . . may be connected to a signal cable. The predetermined cross-sectional external shape may be, for example, circular, elliptical, or polygonal. Each of the internal units 115, . . . includes a heat generating body 165, 166, . . . , and a heat sink 175, 176, . . . , respectively.

The heat generating bodies 165, 166, . . . are heat generating bodies (heat generating elements) in the seabed-installed apparatus 105. The heat generating bodies 165, 166, . . . are, for example, LDs.

The heat sinks 175, 176, . . . conduct, to the outside of the device housing 135, heat generated in the heat generating bodies 165, 166, . . . . The heat sinks 175, 176, . . . are, for example, blocks made of metal.

The heat conduction units 125, . . . are good conductors of heat and have the same predetermined cross-sectional external shape as the internal units 115, . . . . However, external shapes of the heat conduction units 125, . . . in a direction perpendicular to the predetermined cross section may be different from each other. The heat conduction units 125, . . . dissipate, to the device housing 135 or the adjacent heat conduction units 125, . . . , heat conducted from the adjacent internal units 115, . . . . The heat conduction units 125, . . . are made of, for example, metal (copper, aluminum, or the like) or carbon (graphite, carbon nanotubes, diamond, or the like), and have a plate-like external shape (an inside may be a cavity).

The device housing 135 is capable of storing two or more of the internal units 115, . . . or the heat conduction units 125, . . . (hereinafter, also referred to simply as "unit") in a state in which the internal units 115, . . . or the heat conduction units 125, are adjacent to each other in a direction (X direction in FIG. 4) in which the predetermined cross-sectional external shapes overlap each other. Herein, the device housing 135 thermally connects adjacent units. The device housing 135 may thermally connect the adjacent units by, for example, storing the adjacent units in such a way as to overlap and contact each other in the X direction. The device housing 135 is also thermally connected to the stored unit. The device housing 135 is thermally connected to the stored unit, for example, by the stored unit contacting an inner surface of the device housing 135. In the example illustrated in FIG. 4, the device housing 135 has a cylindrical shape or a rectangular cylindrical shape having both bottom surfaces. The device housing 135 stores one or more of the internal units 115, . . . and one or more of the heat conduction units 125, . . . in a state in which an outer surface of the stored unit contacts the inner surface of the device housing 135. The device housing 135 may be thermally connected to the stored unit via, for example, a heat conductive sheet, a metal member, a carbon member, a refrigerant (e.g., a fluorine-based inert liquid), or the like.

Another configuration in the present example embodiment is the same as the configuration in the first example embodiment.

An operation in the present example embodiment will be described.

The internal units 115, . . . are thermally connected to the heat conduction units 125, . . . , and the internal units 115, . . . and the heat conduction units 125, . . . are thermally connected to the device housing 135. As a result, heat generated in the internal units 115, . . . is conducted to the device housing 135 directly or via the heat conduction units 125, . . . . The device housing 135 then dissipates the heat conducted to the device housing 135 to the outside of the device housing 135. Specifically, a heat dissipation path is formed by starting from the internal units 115, . . . , passing directly or via the heat conduction units 125, . . . , passing via the device housing 135, and ending at the outside of the seabed-installed apparatus 105 (sea water). In FIG. 4, an example of the heat dissipation path is illustrated by a thick arrow. Herein, a heat dissipation path through the heat conduction units 125, . . . is added, compared to the heat dissipation path in the seabed-installed apparatus 105 and the heat dissipation path in the related seabed-installed apparatus illustrated in FIG. 8.

Figure 5:
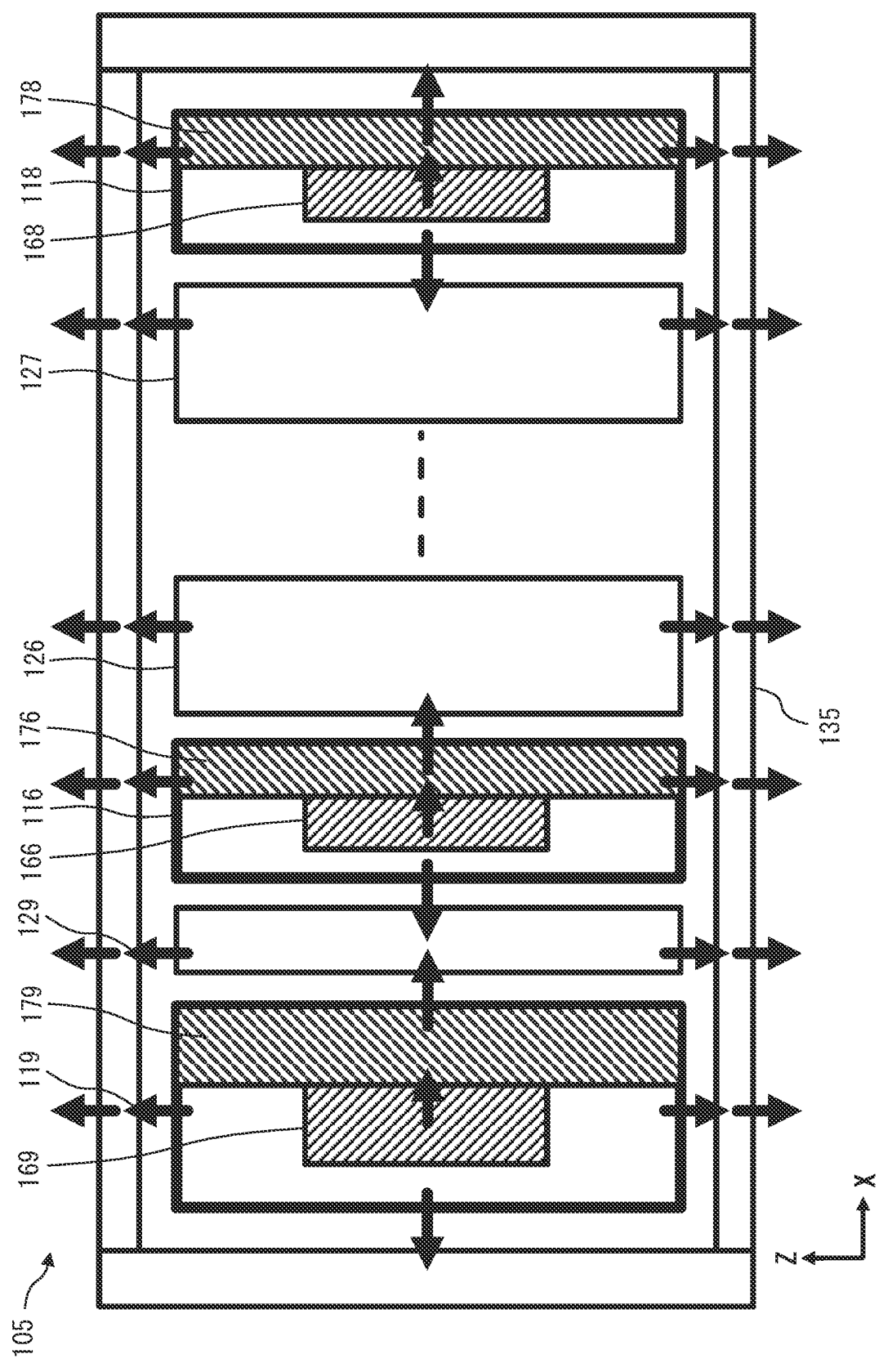
FIG. 5 is a cross-sectional diagram illustrating an operation of the seabed-installed apparatus according to the second example embodiment of the present invention.

FIG. 5 is a cross-sectional diagram illustrating the operation of the seabed-installed apparatus according to the second example embodiment of the present invention.

It is assumed that the internal unit 115 included in the seabed-installed apparatus 105 illustrated in FIG. 4 is replaced with an internal unit 119 as a result of a design change of the unit, as illustrated in FIG. 5. The internal unit 119 is a heat generating body having the same predetermined cross-sectional external shape (in FIGS. 4 and 5, the same shape in the Y-Z plane) as the internal unit 115. However, it is assumed that an external dimension (for example, a width in the X direction in FIG. 5) of the internal unit 119 changes from an external dimension (for example, a width in the X direction in FIG. 4) of the internal unit 115. It is also assumed that an amount of heat generated in the internal unit 119 changes from an amount of heat generated in the internal unit 115.

Similarly, as illustrated in FIG. 5, it is assumed that the internal unit 115 is replaced with the internal unit 119, and accompanying the replacement, the heat conduction unit 125 is replaced with a heat conduction unit 129. The heat conduction unit 129 is a good conductor of heat and has a predetermined cross-sectional external shape that is the same as the heat conduction unit 125 (same as the internal unit 115). However, it is assumed that an external dimension (for example, a width in the X direction in FIG. 5) of the heat conduction unit 129 changes from an external dimension (for example, a width in the X direction in FIG. 4) of the heat conduction unit 125. However, the external dimension of the heat conduction unit 129 is determined in such a way that an external dimension (for example, a width in the X direction and a cross-sectional external shape in the Y-Z plane in FIG. 5) acquired by combining the internal unit 119 and the heat conduction unit 129 is the same as the external dimension (For example, a width in the X direction and a cross-sectional external shape in the Y-Z plane in FIG. 4) acquired by combining the internal unit 115 and the heat conduction unit 125. Herein, thermal resistance of the heat conduction unit 129 may be changed from thermal resistance of the heat conduction unit 125. Specifically, for example, when an amount of heat generated in the internal unit 119 becomes larger than an amount of heat generated in the internal unit 115, the heat conduction unit 129 may be replaced with a unit having lower heat resistance (higher heat dissipation property) than the heat conduction unit 125 according to the amount of heat generated in the internal unit 119. Herein, the heat conduction units 125, . . . , 129 may have different structures, materials, or the like. In FIG. 5, an example of the heat dissipation path is illustrated by a thick arrow. In FIG. 5, a heat dissipation path is formed by starting from the internal unit 119, passing directly or via the heat conduction unit 129, passing via the device housing 135, and ending at the outside of the seabed-installed apparatus 105 (sea water).

(When Design is Made Assuming a Worst Case)

The seabed-installed apparatus 105 may be designed in such a way as to be operatable both before and after a design change of a unit. For example, in the example illustrated in FIGS. 4 and 5, the seabed-installed apparatus 105 may be designed in such a way as to be functionally and thermally capable of normally operating, even when a pair of the internal unit 115, . . . and the heat conduction unit 125, . . . is replaced with a pair of the internal unit 119 and the heat conduction unit 129. This condition is achieved, for example, by setting the thermal resistance of the heat conduction unit 125, . . . in such a way that a temperature of the internal unit 115, . . . does not become equal to or higher than a predetermined temperature in a worst case (a pair of the internal unit 115, . . . having a largest heat generation amount and the heat conduction unit 125, . . . having largest thermal resistance) within a range of assumed design changes.

(When Replacing with a Heat Conduction Unit that Compensates for an Increase in Amount of Heat Generated in an Internal Unit)

In a case where the internal unit 115 is replaced, in accordance with a design change of the internal unit 115, with the internal unit 119 having a larger heat generation amount, the heat conduction unit 125 may be replaced with the heat conduction unit 129 (for example, using a material having a high heat dissipation property, and the like) having heat resistance smaller by an amount being able to cope with an increase in heat generation amount in the internal unit 119.

In the two cases described above, in the seabed-installed apparatus 105, it is unnecessary to change, in accordance with a design change in the one internal unit 115, design of another component other than the heat conduction unit 125 (the device housing 135, the internal units 116, . . . that do not need a design change, . . . , and the like), and to manufacture the another component. In addition, even when there is a related device for installing the seabed-installed apparatus 105 (an installation facility of the seabed-installed apparatus 105, and the like), it is unnecessary to change design of the related device and to manufacture the related device.

In the above description, an example in which the internal unit 115 and the heat conduction unit 125 are replaced with the internal unit 119 and the heat conduction unit 129 has been described. However, the replacement of the unit in the present example embodiment is not limited to the example described above. Specifically, the internal unit 115 may be replaced with a plurality of the internal units 119, . . . . Also, the one heat conduction unit 125, . . . may be replaced with a plurality of the heat conduction units 129, . . . , or may be removed from the seabed-installed apparatus 105. Also, a plurality of the internal units 115, . . . may be replaced with the one internal unit 119. Also, a plurality of the heat conduction units 125, . . . may be replaced with the one heat conduction unit 129, or may be removed from the seabed-installed apparatus 105.

Other operations in the present example embodiment are the same as the operations in the first example embodiment.

As described above, in the seabed-installed apparatus 105 according to the present example embodiment, the internal units 115, . . . , and the heat conduction units 125, . . . have the same predetermined cross-sectional external shape. Further, a design change accompanied by a change in heat generation is made on the internal unit 115. As a result of the design change, the internal unit 115 is replaced with the internal unit 119. Herein, an external shape of the heat conduction unit 129 is determined in such a way that an external shape acquired by combining the internal unit 119 and the heat conduction unit 129 becomes the same as an external shape acquired by combining the internal unit 115 and the heat conduction unit 125. Specifically, a change from the external shape of the internal unit 115 to the external shape of the internal unit 119 (e.g., a change in width in the X direction in FIGS. 4 and 5) is offset by a change from the external shape of the heat conduction unit 125 to the external shape of the heat conduction unit 129 (e.g., a change in width in the X direction in FIGS. 4 and 5). Meanwhile, the unit is designed in such a way as to be operatable both before and after a design change, or the heat conduction unit is capable of coping with an increase in amount of heat generated in the internal unit after a design change. Specifically, in the seabed-installed apparatus 105, it is unnecessary to change, in accordance with the design change of the internal unit 115, design of another component other than the heat conduction unit 125 and the like (the device housing 135, the internal unit 116, . . . that does not need a design change, and the like), and to manufacture the another component. In addition, when there is a related device for installing the seabed-installed apparatus 105 (an installation facility of the seabed-installed apparatus 105, and the like), it is unnecessary to change design of the related device and to manufacture the related device. Therefore, the seabed-installed apparatus 105 according to the present example embodiment has an advantageous effect of suppressing the number of man-hours required to cope with a design change accompanied by a change in heat generated in the internal unit stored in the electric device.

A modification example of the present example embodiment will be described.

Figure 6:
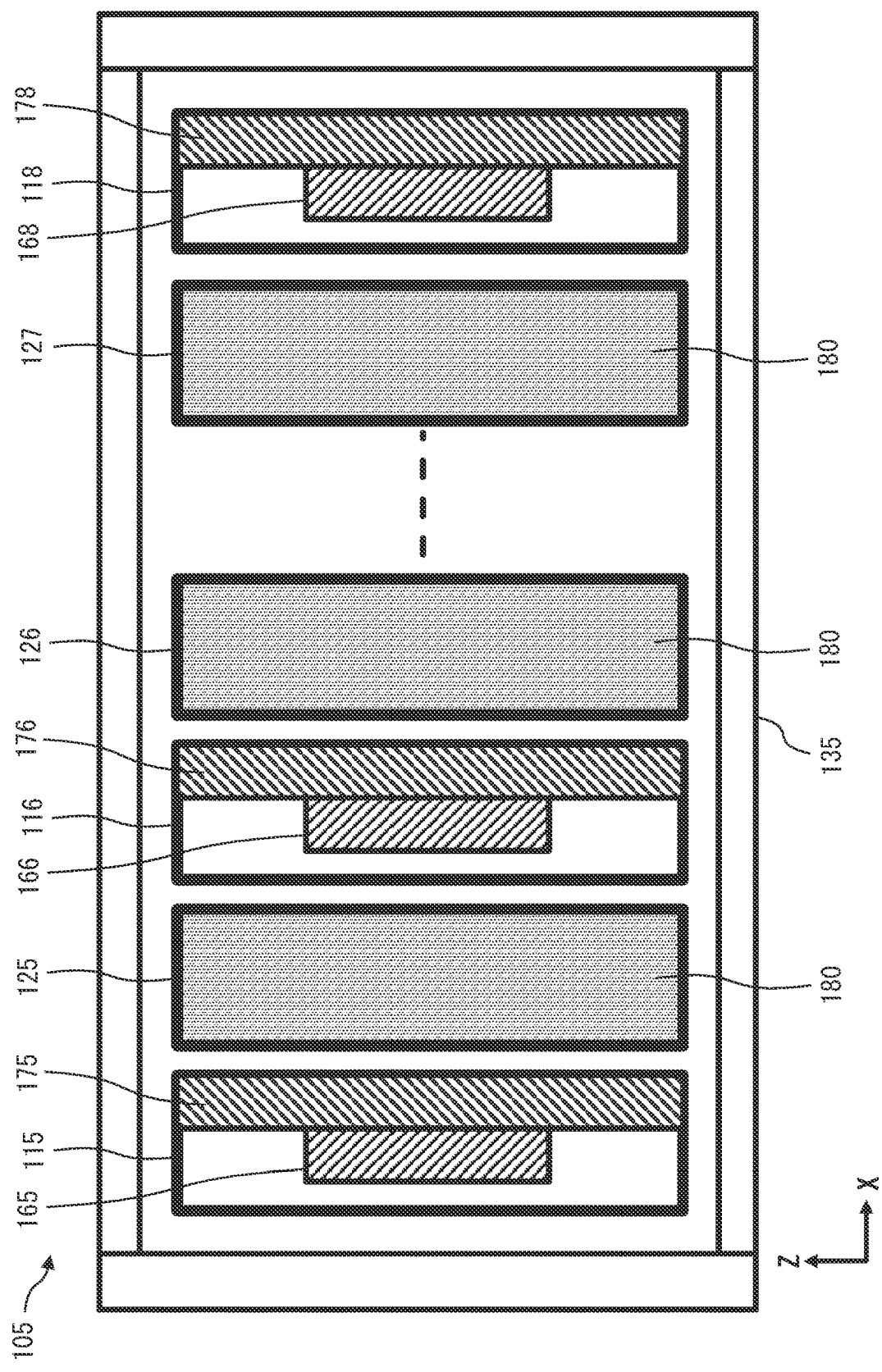
FIG. 6 is a cross-sectional diagram illustrating a modification example of the configuration of the seabed-installed apparatus according to the second example embodiment of the present invention.

FIG. 6 is a cross-sectional diagram illustrating a modification example of the configuration of the seabed-installed apparatus according to the second example embodiment of the present invention. More specifically, FIG. 6 illustrates a cross-sectional diagram in the X-Z plane.

In the seabed-installed apparatus 105 according to the present modification example, the heat conduction units 125, . . . in the above-described present example embodiment are housings made of metal or carbon. A cavity (region 180) of the housing is filled with a refrigerant. The refrigerant is, for example, a fluorine-based inert liquid.

As a result of the above-described configuration, the present modification example has an advantageous effect that the heat conduction unit 125, . . . having a lighter weight can be achieved at a lower cost, compared with a case where the heat conduction unit 125, . . . is a plate made of metal or carbon. In particular, in a case where the refrigerant is a fluorine-based inert liquid, even when the refrigerant leaks from the heat conduction unit 125, there is an advantageous effect that the seabed-installed apparatus 105 is not damaged.

Another modification example of the present example embodiment will be described.

Figure 7:
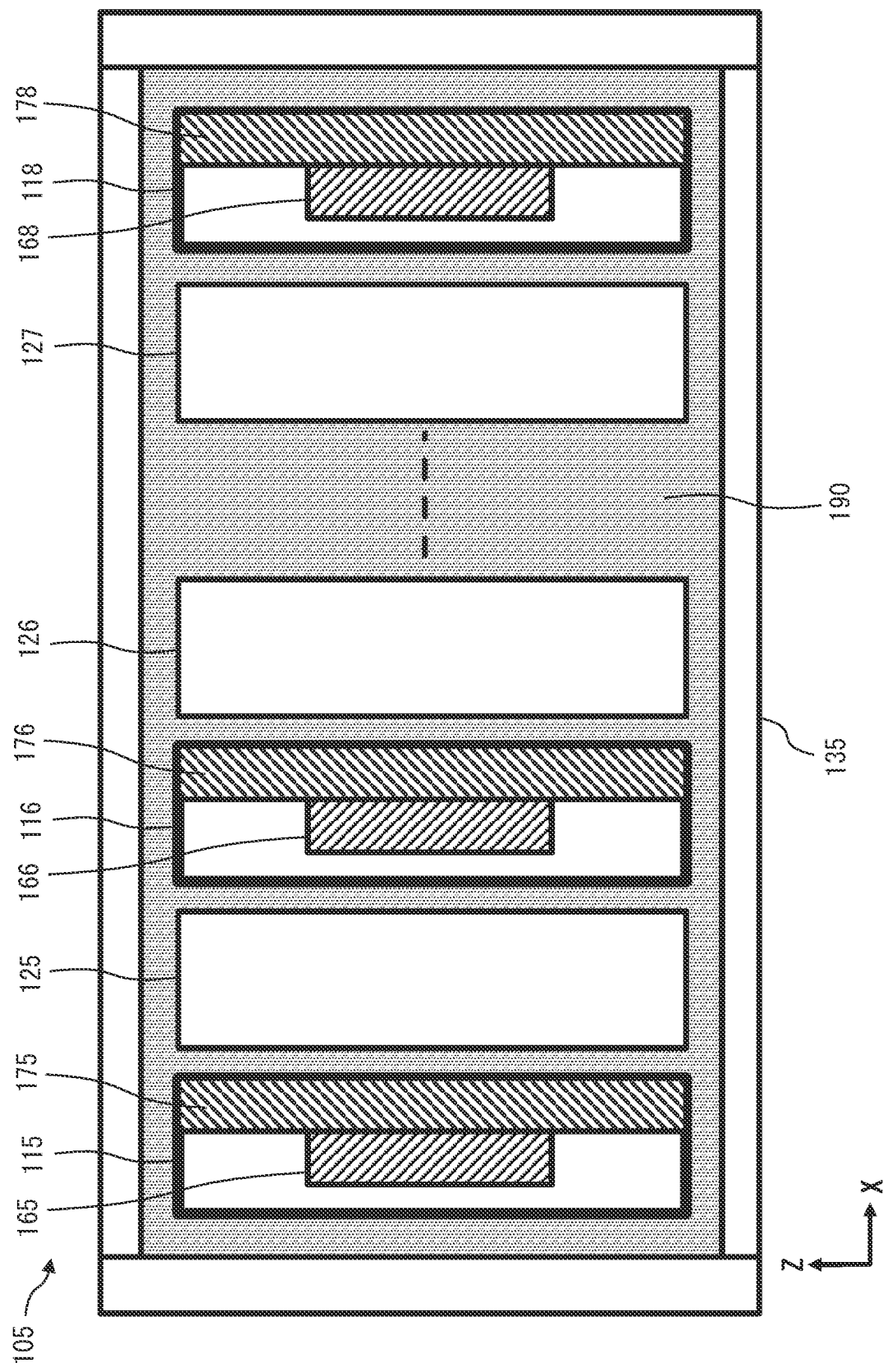
FIG. 7 is a cross-sectional diagram illustrating another modification example of the configuration of the seabed-installed apparatus according to the second example embodiment of the present invention.

FIG. 7 is a cross-sectional diagram illustrating another modification example of the configuration of the seabed-installed apparatus according to the second example embodiment of the present invention. More specifically, FIG. 7 illustrates a cross-sectional diagram in the X-Z plane.

In the seabed-installed apparatus 105 according to the present modification example, a cavity (region 190) of the device housing 135 in the above-described example embodiment is filled with a refrigerant. The refrigerant is, for example, a fluorine-based inert liquid.

As a result of the above-described configuration, the present modification example has an advantageous effect that a heat dissipation property of the seabed-installed apparatus 105 can be further enhanced. In particular, when the refrigerant is a fluorine-based inert liquid, even when the refrigerant leaks into the internal units 115, . . . , there is an advantageous effect that the internal units 115, . . . are not damaged.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims. In such a case, a new example embodiment with such changes or improvements may also be included within the technical scope of the present invention. This is obvious from the matters described in the claims.

This application is based upon and claims the benefit of priority from Japanese patent application No. 2018-177616, filed on Sep. 21, 2018, the disclosure of which is incorporated herein in its entirety by reference.

A part or the entirety of the above-described example embodiments may also be described as the following supplementary notes, but not limited thereto.

(Supplementary Note 1)

An electric device comprising:
one or more internal units that are heat generating bodies having a predetermined cross-sectional external shape;
one or more heat conduction units that are good conductors of heat and have the predetermined cross-sectional external shape; and
a device housing that is capable of storing two or more of the internal units or the heat conduction units in a state in which the internal units or the heat conduction units are adjacent to each other in a direction in which the predetermined cross-sectional external shapes overlap each other, and is thermally connected to the stored internal units or the stored heat conduction units.

(Supplementary Note 2)

The electric device according to Supplementary note 1, wherein,
in a case where, in accordance with a design change of the original internal unit, the original internal unit is replaced with another of the internal units and the original heat conduction unit is replaced with another of the heat conduction units, a width in a direction perpendicular to the predetermined cross-sectional external shape acquired by combining the another internal unit and the another heat conduction unit is equal to a width in the direction perpendicular to the predetermined cross-sectional external shape acquired by combining the original internal unit and the original heat conduction unit.

(Supplementary Note 3)

The electric device according to Supplementary note 1 or 2, wherein,
in a pair of the one or more internal units having a largest heat generation amount and the one or more heat conduction units having largest thermal resistance within a range of assumed design changes, thermal resistance of the one or more heat conduction units is set in such a way that a temperature of the one or more internal units does not become equal to or higher than a predetermined temperature.

(Supplementary Note 4)

The electric device according to Supplementary note 1 or 2, wherein,
when the original internal unit is replaced, in accordance with a design change of the original internal unit, with another of the internal units having a higher heat generation amount, the original heat conduction unit is replaced with the another heat conduction unit having thermal resistance smaller by an amount being able to cope with an increase in heat generation amount in the original internal unit.

(Supplementary Note 5)

The electric device according to any one of Supplementary notes 1 to 4, wherein
one of the internal units and another of the internal units being stored in the device housing are connected to each other via a signal cable, and
between the two internal units connected to each other via the signal cable, one or more of the heat conduction units stored in the device housing have a slot part through which the signal cable can be threaded.

(Supplementary Note 6)

The electric device according to any one of Supplementary notes 1 to 5, wherein
the heat conduction unit is a plate made of metal or carbon.

(Supplementary Note 7)

The electric device according to any one of Supplementary notes 1 to 5, wherein
the heat conduction unit is a housing made of metal or carbon, and filled with a first refrigerant.

(Supplementary Note 8)

The electric device according to Supplementary note 7, wherein
the first refrigerant is a fluorine-based inert liquid.

(Supplementary Note 9)

The electric device according to any one of Supplementary notes 1 to 8, wherein
the device housing is filled with a second refrigerant.

(Supplementary Note 10)

The electric device according to Supplementary note 9, wherein
the second refrigerant is a fluorine-based inert liquid.

(Supplementary Note 11)

The electric device according to any one of Supplementary notes 1 to 10, wherein
at least one of the internal units includes a laser diode.

(Supplementary Note 12)

The electric device according to any one of Supplementary notes 1 to 11, wherein
the electric device is an optical submarine cable repeater installed on a seabed.

INDUSTRIAL APPLICABILITY

The present invention is able to be used in an electric device in an application for achieving efficient heat dissipation.

REFERENCE SIGNS LIST 100, 102 Electric device
105 Seabed-installed apparatus
110, 111, 115, 116, 119 Internal unit
120, 121, 122, 125, 129 Heat conduction unit
130, 135 Device housing
140 Signal cable
150 Slot part
165, 166, 169 Heat generating body
175, 176, 179 Heat sink
180 Region
190 Region
200 Seabed-installed apparatus
211, 212 Internal unit
230 Device housing
261, 262 Heat generating body
271, 272 Heat sink

What is claimed is:

1. An electric device comprising:
first internal units that are heat generating bodies having a predetermined cross-sectional external shape; and
first heat conduction units that are conductors of heat, have the predetermined cross-sectional external shape, and are thermally connected to the first internal units, wherein the first internal units and the first heat conduction units are alternately stacked multiple times in a direction in which the predetermined cross-sectional external shape of each of the first internal units and the first heat conduction units overlap each other, the first internal units and the first heat conduction units as alternately stacked the multiple times are stored in a device housing to which the first internal units and the first heat conduction units are thermally connected, and the first heat conduction units are housings made of metal or carbon, and filled with a first refrigerant.

2. The electric device according to claim 1, wherein, in a case where, in accordance with a design change of the first internal units, the first internal units are replaced with second internal units and the first heat conduction units are replaced with second heat conduction units, a width in a direction perpendicular to the predetermined cross-sectional external shape acquired by combining the second internal units and the second heat conduction units is equal to a width in the direction perpendicular to the predetermined cross-sectional external shape acquired by combining the first internal units and the first heat conduction units.

3. The electric device according to claim 2, wherein, in a pair of one of the first internal units having a largest heat generation amount and one of the first heat conduction units having a largest thermal resistance within a predetermined range, thermal resistance of the one of the first heat conduction units is set such that a temperature of the one of the first internal units does not become equal to or higher than a predetermined temperature.

4. The electric device according to claim 2, wherein, when the first internal units are replaced, in accordance with a design change of the first internal units, with second internal units having a higher heat generation amount, the first heat conduction units are replaced with second heat conduction units having a thermal resistance that is smaller by an amount able to cope with the higher heat generation amount.

5. The electric device according to claim 2, wherein one of the first internal units and another of the first internal units stored in the device housing are connected to each other via a signal cable, and between the two first internal units connected to each other via the signal cable, one or more of the first heat conduction units stored in the device housing have a slot part through which the signal cable is able to be threaded.

6. The electric device according to claim 1, wherein, in a pair of one of the first internal units having a largest heat generation amount and one of the first heat conduction units having a largest thermal resistance within a predetermined range, thermal resistance of the one of the first heat conduction units is set such that a temperature of the one of the first internal units does not become equal to or higher than a predetermined temperature.

7. The electric device according to claim 6, wherein one of the first internal units and another of the first internal units stored in the device housing are connected to each other via a signal cable, and between the two first internal units connected to each other via the signal cable, one or more of the first heat conduction units stored in the device housing have a slot part through which the signal cable is able to be threaded.

8. The electric device according to claim 1, wherein, when the first internal units are replaced, in accordance with a design change of the first internal units, with second internal units having a higher heat generation amount, the first heat conduction units are replaced with second heat conduction units having a thermal resistance that is smaller by an amount able to cope with the higher heat generation amount.

9. The electric device according to claim 8, wherein one of the first internal units and another of the first internal units stored in the device housing are connected to each other via a signal cable, and between the two first internal units connected to each other via the signal cable, one or more of the first heat conduction units stored in the device housing have a slot part through which the signal cable is able to be threaded.

10. The electric device according to claim 1, wherein one of the first internal units and another of the first internal units stored in the device housing are connected to each other via a signal cable, and between the two first internal units connected to each other via the signal cable, one or more of the first heat conduction units stored in the device housing have a slot part through which the signal cable is able to be threaded.

11. The electric device according to claim 1, wherein the first refrigerant is a fluorine-based inert liquid.

12. The electric device according to claim 1, wherein the device housing is filled with a second refrigerant.

13. The electric device according to claim 12, wherein the second refrigerant is a fluorine-based inert liquid.

14. The electric device according to claim 1, wherein at least one of the first internal units includes a laser diode.

15. The electric device according to claim 1, wherein the electric device is an optical submarine cable repeater installed on a seabed.

16. An electric device comprising:

first internal units that are heat generating bodies having a predetermined cross-sectional external shape; and first heat conduction units that are conductors of heat, have the predetermined cross-sectional external shape, and are thermally connected to the first internal units, wherein the first internal units and the first heat conduction units are alternately stacked multiple times in a direction in which the predetermined cross-sectional external shape of each of the first internal units and the first heat conduction units overlap each other, the first internal units and the first heat conduction units as alternately stacked the multiple times are stored in a device housing to which the first internal units and the first heat conduction units are thermally connected, and when the first internal units are replaced, in accordance with a design change of the first internal units, with second internal units having a higher heat generation amount, the first heat conduction units are replaced with second heat conduction units having a thermal resistance that is smaller by an amount able to cope with the higher heat generation amount.

17. The electric device according to claim 16, wherein the first heat conduction units are plates made of metal or carbon.

18. An electric device comprising:

first internal units that are heat generating bodies having a predetermined cross-sectional external shape; and first heat conduction units that are conductors of heat, have the predetermined cross-sectional external shape, and are thermally connected to the first internal units, wherein the first internal units and the first heat conduction units are alternately stacked multiple times in a direction in which the predetermined cross-sectional external shape of each of the first internal units and the first heat conduction units overlap each other, and the first internal units and the first heat conduction units as alternately stacked the multiple times are stored in a device housing to which the first internal units and the first heat conduction units are thermally connected, in a case where, in accordance with a design change of the first internal units, the first internal units are replaced with second internal units and the first heat conduction units are replaced with second heat conduction units, a width in a direction perpendicular to the predetermined cross-sectional external shape acquired by combining the second internal units and the second heat conduction units is equal to a width in the direction perpendicular to the predetermined cross-sectional external shape acquired by combining the first internal units and the first heat conduction units, and when the first internal units are replaced, in accordance with the design change of the first internal units, with the second internal units having a higher heat generation amount, the first heat conduction units are replaced with the second heat conduction units having a thermal resistance that is smaller by an amount able to cope with the higher heat generation amount.

19. The electric device according to claim 18, wherein, in a pair of one of the first internal units having a largest heat generation amount and one of the first heat conduction units having a largest thermal resistance within a range of assumed design changes, thermal resistance of the one of the first heat conduction units is set in such a way that a temperature of the one of the first internal units does not become equal to or higher than a predetermined temperature.

\* \* \* \* \*